United States Patent [19]

Skunes et al.

[11] Patent Number: 5,005,978
[45] Date of Patent: Apr. 9, 1991

[54] APPARATUS AND METHOD FOR THE NONCONTACT MEASUREMENT OF DRILL DIAMETER, RUNOUT, AND TIP POSITION

[75] Inventors: Timothy A. Skunes, Columbia Heights; Steven K. Case, St. Louis Park; Jeffrey A. Jalkio, St. Paul, all of Minn.

[73] Assignee: CyberOptics Corporation, Minneapolis, Minn.

[21] Appl. No.: 433,620

[22] Filed: Nov. 6, 1989

[51] Int. Cl.$^5$ .................. G01B 11/00; G01B 11/04
[52] U.S. Cl. .................................. 356/372; 356/385; 250/560
[58] Field of Search ............... 356/372, 378, 379, 381, 356/384–387, 426; 250/560, 561; 33/201, 203, 203.12, 626, 639, 632, 638

[56] References Cited

U.S. PATENT DOCUMENTS

4,657,395 4/1987 Shiraishi et al. .................. 356/385
4,678,337 7/1987 Cohen et al. ...................... 356/387

*Primary Examiner*—Richard A. Rosenberger
*Assistant Examiner*—Hoa Pham
*Attorney, Agent, or Firm*—Dorsey & Whitney

[57] ABSTRACT

A laser based, noncontacting measurement instrument is particularly adapted for the printed circuit board drilling industry to measure drill diameter, runout, and tip position under actual operating conditions. A laser beam is focused in space and the amount of light occluded by the drill bit as the bit is passed through the beam is sensed by a detector. Diameter, runout, and tip position are calculated by measuring the amount of occlusion, monitoring the position and angular orientation of the rotating drill, and correlating the amount of light occlusion to the position and angular orientation of the drill. The instrument automatically compensates for dust and debris in the optical path.

32 Claims, 6 Drawing Sheets

APPARATUS AND METHOD FOR THE NONCONTACT MEASUREMENT OF DRILL DIAMETER, RUNOUT, AND TIP POSITION

TECHNICAL FIELD

The disclosed invention relates to noncontact, high accuracy measurement instruments. In particular, it relates to a laser based instrument particularly adapted for on-line, noncontact measurement of the diameter, runout and vertical position of the drill bit of an automated printed circuit board drilling machine.

BACKGROUND

Automated drilling of holes in circuit boards is typically accomplished by mounting the circuit board to the worktable of an automated circuit board drilling machine. An example of such a machine would be the the Concept 4 drilling and routing machine available from Excellon Automation of Torrence, Calif. The circuit board is accurately positioned on a worktable platten below a spindle which rotates a drill bit. The spindle is lowered and the drill bit creates a hole through the circuit board. The entire drilling process is usually coordinated by a host processor The processor controls such things as worktable positioning, spindle feed rates, spindle rpm, and automatic drill bit changing.

The need for small pads, thin conductor lines, and narrow line spacings in printed circuit boards requires automated circuit board drilling machines to have both high positional accuracy and the ability to drill high quality, small diameter holes. Verification of drill bit diameter, runout, and tip position is necessary to ensure high hole quality.

Drill bit diameter checking is necessary to avoid drilling the wrong hole size and thus producing defective boards. Drill bit diameter has in the past been checked "off-line" by a mechanical micrometer. However, there is a risk of damaging or breaking the drill bit when using contact measurement tools, especially with very small diameter drill bits. (Typical drill bit diameters can range from 0.004 inch to 0.250 inch.) Moreover, off-line measurements of drill bit diameter lack the ability to make dynamic measurements of drill bit dimensions, and cannot make real time verifications that the proper size bit is loaded in the spindle.

Runout is defined as the amount of asymmetry in the drill position as it rotates. The asymmetric motion may be due to a bent or wobbling drill, asymmetry of the drill geometry about its center of rotation, or vibrations in the spindle. Excessive runout can result in enlarged holes, inaccurate drilling, or tool breakage. Currently, runout is typically measured quasi-statically by placing a mechanical dial indicator in contact with a precision pin inserted in the spindle. The spindle is then rotated by hand and the amount of deflection of the dial indicator is noted. Dynamic runout measurements may be made by using a capacitive sensor and a precision pin. Both of these methods, however, only measure spindle runout. Neither method measures dynamic runout of each individual drill bit under actual usage conditions. The mass of the drill bit, its geometry, its seating in the chuck, and the spindle rpm all affect the runout. Smaller diameter drills are typically operated at higher rpm's than larger diameter drills, exacerbating the discrepancy between static and dynamic runout measurements.

Accurate drill tip positioning is required to drill blind hole vias. Blind hole vias are holes which are drilled only partially through a circuit board and are used to connect separate layers of a multilayer circuit board. (See FIG. 1a.) Accurate tip positioning is also required to increase production throughput. Proper and accurate vertical positioning of the drill bit avoids the wasted time caused by drilling or retracting the drill too far, and also prevents tool breakage caused by drilling too far past the circuit board.

While noncontact equipment for measuring the dimensions of objects such as drill bits is available, conventional noncontact instruments generally require a scanning laser beam, and are typically too bulky to be used on-line in conjunction with an automated circuit board drilling machine. In addition, the measurement methodology of such previous equipment is unable to differentiate between drill diameter and runout, and often provides diameter and runout as a single, combined reading. Conventional drill tip positioning methods require contact with the drill bit, often causing chipping or breakage of the drill bit. Moreover, conventional laser based sensors placed in proximity to an automated circuit board drilling apparatus would be susceptible to measurement error due to the varying occlusion of light in the measurement field by the dust residue caused by the drilling. As such, there have not been any automated circuit board drilling machines capable of verifying drill bit diameter immediately after each individual drill is loaded in the spindle, of determining dynamic runout, or capable of accurately positioning, in a noncontacting manner, the drill tip in relationship to a board mounted for drilling.

SUMMARY OF THE INVENTION

The present invention provides for on-line measurement of drill bit diameter, dynamic runout, and drill tip position of the drill bit used in an automated printed circuit board drilling machine. The dimensions and operating characteristics of the drill bit are measured at full operational drill speed through the use of a fixed beam laser based sensor. The amount of laser beam blockage caused by the bit as it is passed through the laser beam is correlated with the instantaneous angular orientation of the drill bit as it enters the laser beam. The instrument is able to provide accurate measurements, without internal moving parts, by taking advantage of the precise positional control over worktable and spindle position provided by the automated drilling machine. The measurement instrument includes compensation circuitry that automatically adjusts the instrument for light occlusion caused by the dust and debris by-products of the drilling operation.

DESCRIPTION OF THE PREFERRED EMBODIMENT

Figures 1, 1A:
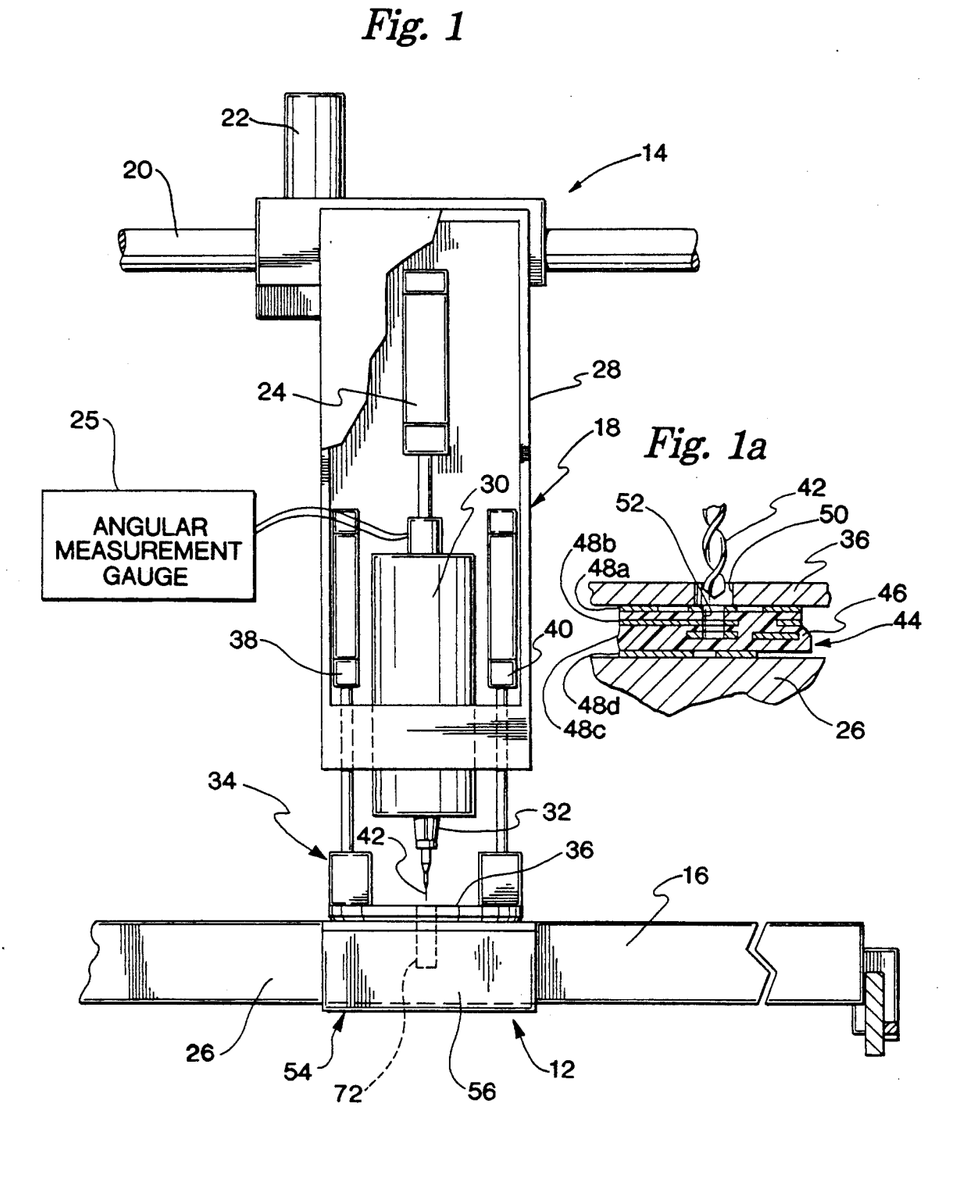
FIG. 1 is a fragmentary, front elevational view of an automated circuit board drilling machine having a laser based measurement instrument in accordance with the present invention mounted thereon.
FIG. 1a is an enlarged, fragmentary view of a printed circuit board mounted on an automated circuit board drilling machine with a blind hole via drilled into the board.

Referring to FIG. 1, a measurement instrument 12 for the noncontact measurement of drill bit diameter, runout, and tip position is depicted in conjunction with an automated circuit board drilling machine 14. The drilling machine 14 broadly includes a drilling platten 16 which can accommodate a plurality of circuit boards to be drilled, a drill 18, drill horizontal positioning rods 20, 22, and drill vertical positioning piston and cylinder assembly 24. A control module (not shown) includes the electronic circuitry for precise three dimensional positioning of the drill 18 in relation to the platten 16. Angular measurement gauge 25 monitors the angular (rotational) orientation of the drill 18. The measurement instrument 12 is fixedly positioned to the leading margin 26 of the worktable platten 16, such that the x and y coordinates (see FIG. 3) of the instrument relative to the platten 16 are fixed, and can be determined by the control module.

The drill 18 includes drill case 28, drill motor 30, chuck 32, and board press 34. The board press 34 includes pressure plate 36 and pressure bearing piston and cylinder assemblies 38, 40. A detachable drill bit 42 is carried by the drill chuck 32.

Referring to FIG. 1a, a printed circuit board 44 is depicted positioned between the upper surface of platten 26 and pressure plate 36. The printed circuit board 44 includes electrically nonconducting substrate 46 and a plurality of conducting lines 48 positioned within the substrate 46 in a plurality of conducting layers 48a, 48b, 48c, 48d. The drill bit 42 is depicted in FIG. 1a as being withdrawn from drill bit receiving aperture 50 of pressure plate 36 after drilling a blind hole via 52 to connect conducting layers 48a, 48b, and 48c.

Figures 2, 5:
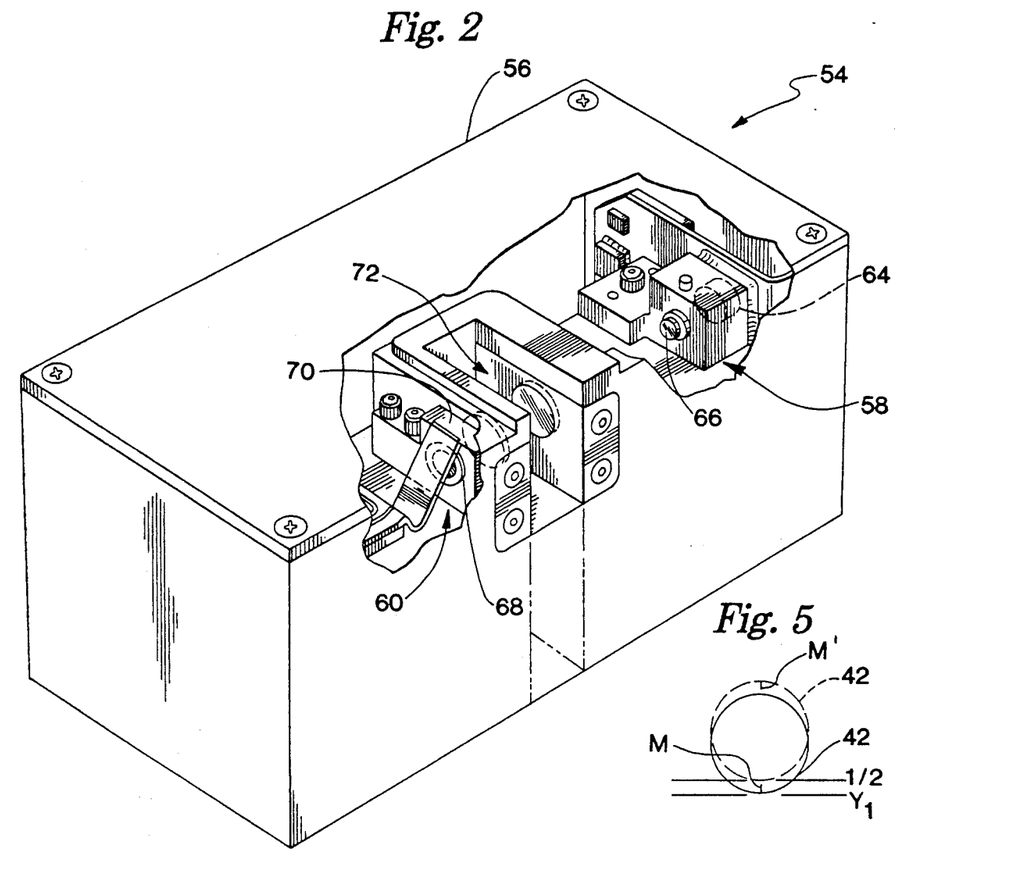
FIG. 2 is a cut away, perspective view of the sensor head of the measurement instrument in accordance with the present invention.
FIG. 5 is a schematic diagram of a drill bit depicting the measurement of drill bit runout.
Figure 3:
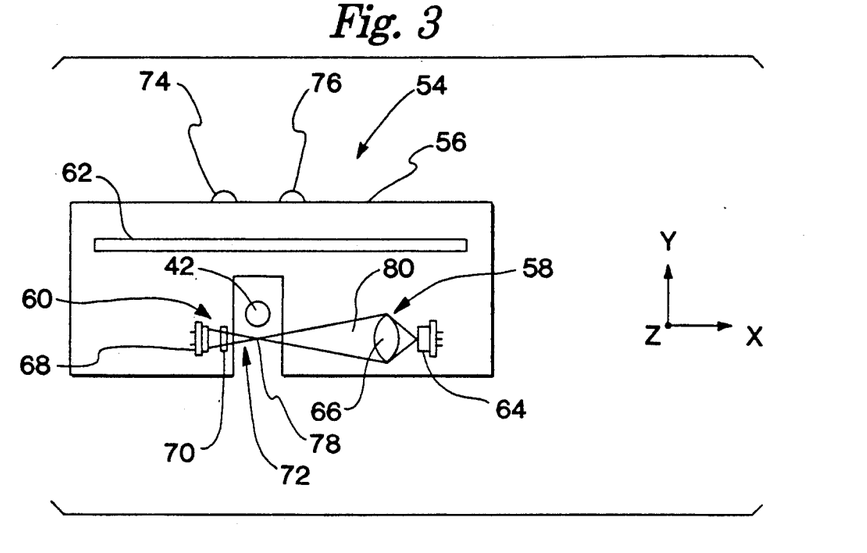
FIG. 3 is a top, schematic view of the sensor head of the measurement instrument.
Figure 4:
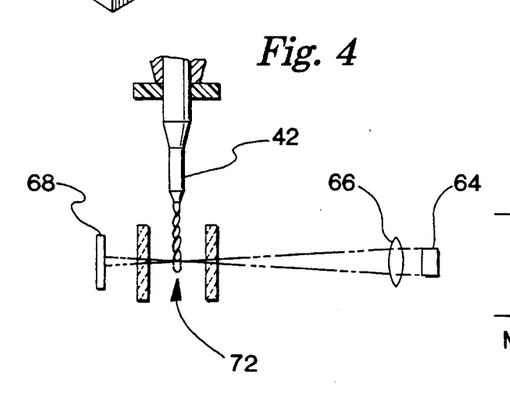
FIG. 4 is a schematic diagram depicting a drill bit positioned in the laser beam of the measurement instrument.

The sensor head 54 of measurement instrument 12 is depicted in FIGS. 2 and 3. Sensor head 54 broadly includes sensor body 56, laser beam transmission end 58, laser beam receiving end 60, and sensor electronics 62. The laser transmitting end includes laser diode 64 and focusing lens 66. The laser receiving end 60 includes detector 68 and optical filter 70. The filter 70 blocks visible light so that detector 68 is blind to ambient illumination. The sensor body 56 includes cavity 72 defining a measurement field between the laser transmitting end 58 and laser receiving end 60. A pair of status indicating LEDs 74, 76 are positioned on the sensor body 56 for indicating power and fault status of the sensor head 54.

The sensor electronics 62, as well as the decision logic of electronics 77 are described in detail in conjunction with FIGS. 7 through 11. The measurement theory and operation of the measurement instrument 12 will be described prior to describing the electronic circuitry in detail.

Measurement of drill bit diameter, runout, and drill tip position by instrument 12 is based on passing the drill bit 42 through the focal point 78 of focused laser beam 80, and determining the position of the drill bit 42 when it blocks all or a portion of the focused laser beam 80. The diameter of the laser beam 80 at the focal point 78 is typically 0.001 inch, allowing for a highly accurate indication of when the drill bit 42 enters the beam 80. Moreover, a typical circuit board drilling machine is able to position the drill 18 in the horizontal x and y axes relative to the platten 16 with a positioning accuracy of 0.0001 inch, and in the vertical z axis with an accuracy of 0.0002 inch.

Blockage of the laser beam 80 is determined by the measurement instrument 12 by monitoring the output of the detector 68 and determining when the detector output is nominally 50 percent of its full scale value. The angular measurement gauge 25 provides readings of the angular orientation of the drill bit 42 while the drill bit is within the laser beam 80. The drill diameter, runout, and tip position are calculated by recording the positions of the drill bit in the x, y and z axes, and the angular orientation of the drill bit 42, when beam blockage and unblockage occurs.

More particularly, measurement of drill diameter and runout is explained with reference to FIGS. 3 through 6. The drill bit 42 is first positioned within the measurement field cavity 72 of sensor body 56 as depicted in FIG. 3, and is rotated at operational speed by the drill chuck 32. The sensor head 54 and drill bit 42 are then shifted in relative motion to each other such that the sensor head 54 is shifted in the y direction (see FIG. 3) in relation to the drill bit 42. When the drill bit 42 first blocks the focused laser beam 78, the position of the sensor body 56 (as annotated as y1 in FIG. 5) is recorded. At the same time as the beam 78 is first blocked by the drill bit 42, the angular measurement gauge 25 is read and the angular orientation of the drill bit 42 is recorded. The reference angle so recorded is indicated by a tick mark M on the drill body 42 in FIG. 5.

Assuming that the drill bit 42 exhibits runout, the operating envelope defined by the drill bit 42 will be larger than the diameter of the drill bit, and one side of the body of drill bit 42 will block the beam 78 before the other side of the drill bit 42 does. Measuring the position of the sensor head 54 relative to the drill bit 42 at the time beam blockage occurs with the drill bit 42 rotated 180° from the angular orientation indicated by M in FIG. 5 provides a measure of the runout. In particular, when the drill bit 42 has rotated 180°, as indicated in phantom lines in FIG. 5 and by mark M', beam blockage occurs at position y2. The difference between positions y2 and y1 is equal to the drill runout of the drill bit 42.

Figure 6:
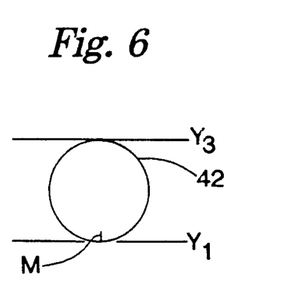
FIG. 6 is a schematic diagram of a drill bit depicting the measurement of drill bit diameter.

Referring to FIG. 6, drill diameter is determined by continuing to shift the sensor body 56 in the y direction relative to drill bit 42, while also monitoring the angular orientation of the drill bit 42. Position y1 in FIG. 6, as in FIG. 5, indicates the position of the sensor body 56 when beam blockage first occurs as the sensor body 56 is moved in the y axis relative to the drill bit 42. Again, as in FIG. 6, the mark M in FIG. 6. indicates the angular orientation of the drill bit 42 when beam blockage first occurs. Position y3 indicates the position of the sensor body in the y axis when the drill bit 42 no longer occludes the laser beam 80 and the drill bit is in the same angular orientation as it was at y1. The difference between position y3 and y1 is equal to the diameter of the drill bit 42.

The position of drill tip 42 in the vertical direction is determined by positioning the focal point 78 of laser beam 80 directly below the axis of rotation of drill bit 42. The position of the focal point 78 is known from the previous measurement of drill diameter In particular, the position of focal point 78 is midway between y1 and y3. Chuck 32, and therefore the drill bit 42, is then lowered until the laser beam 78 is blocked by the drill bit 42. The vertical position of the chuck 32 at the time of beam blockage is recorded to accurately locate the drill tip 42 in the vertical direction (z axis).

Figure 7:
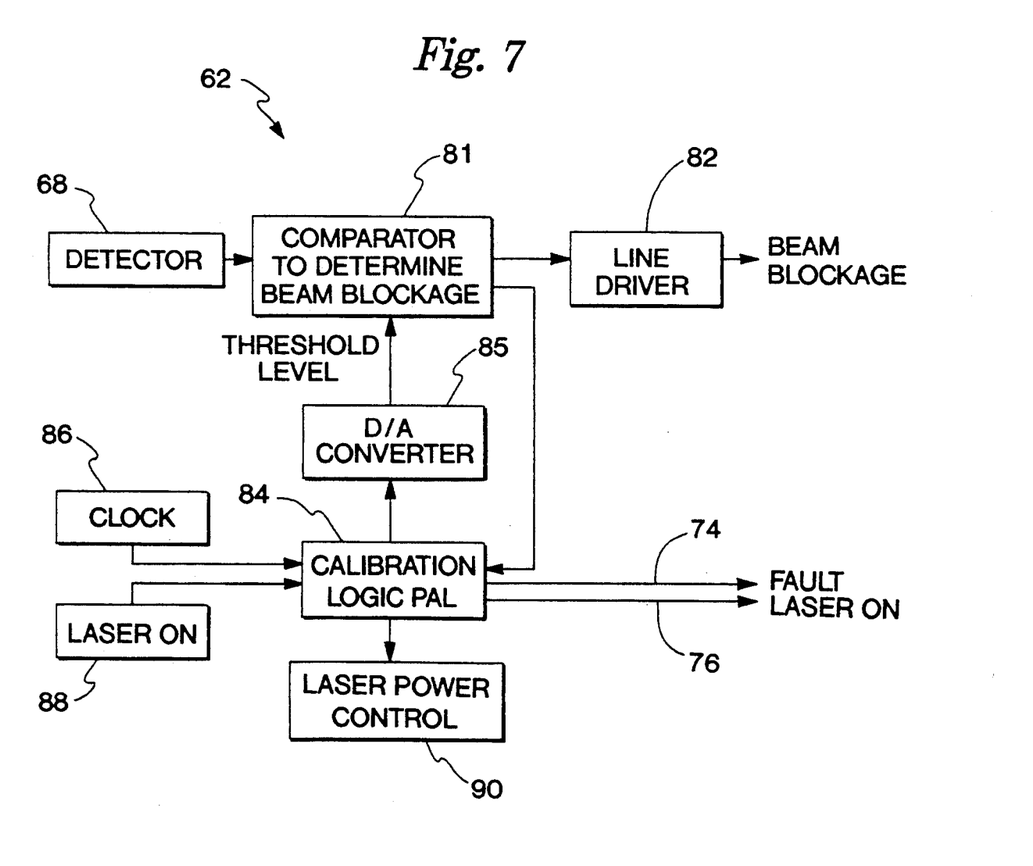
FIG. 7 is a block diagram of the sensor head electronics of the measurement instrument.
Figure 8:
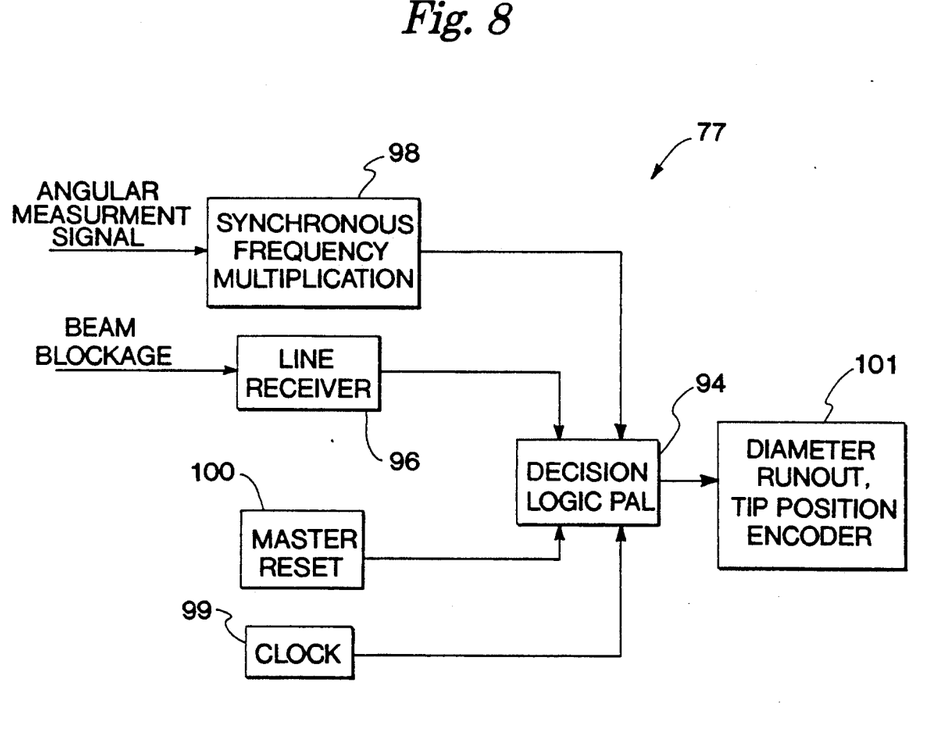
FIG. 8 is a block diagram of the decision logic electronics of the measurement instrument.

The electronic circuitry of the measurement instrument 12 is depicted in block diagram format in FIGS. 7 and 8. In particular, the sensor head electronics 62 are depicted in FIG. 7, and the decision logic circuitry 77 is depicted in FIG. 8.

Referring to FIG. 7, the sensor electronics 62 include detector 68 (also depicted in FIGS. 2 and 3), comparator 81, and line driver 82. The detector 68 provides a voltage output level, corresponding to the amount of light impinging on the detector 68, to comparator 81. The output voltage of detector 68 is accordingly inversely related to the amount of blockage of laser beam 80. Comparator 81 compares the detector output voltage to a stepped reference voltage controlled by programmable array logic device (PAL) 84, thereby providing an output measurement of beam blockage to line driver 82.

PAL 84 turns the laser power control 90 on and off, drives the D/A converter 85 to provide the stepped reference voltage to comparator 81, and includes calibration logic for automatically adjusting the reference voltage applied to comparator 81 to compensate for occlusion of the laser beam 80 due to dust and debris in the measurement field cavity 72. The PAL 84 receives inputs from clock 86, laser on switch 88, and comparator 81. Outputs from the PAL 84 are provided through D/A converter 85 for input to comparator 81, to laser power control circuitry 90, and to the fault and "laser on" indicating LEDs 74, 76. The operation of PAL 84 is described more fully in conjunction with the logic flow sequence diagram of FIG. 9, following the description of the decision logic circuitry 77.

Referring to FIGS. 7 and 8, the decision logic circuitry 77 is based around decision logic programmable array logic device (PAL) 94. Inputs to the decision logic PAL 94 include the beam blockage signal received from line driver 82 through line receiver 96, and a signal relating to the angular orientation of drill bit 42 from the angular measurement gauge 25. The angular measurement orientation signal is received via a synchronous frequency multiplier 98. Decision logic PAL 94 also receives inputs from a clock 99 and a master reset 100. The output of the decision logic PAL 94 drives a drill bit diameter, runout and tip position encoder 101.

The decision logic PAL 94 is programmed in distinct logical function blocks. Included in the PAL 94 is a positive edge detector, a counter, and a decision logic unit. The positive edge detector is used to condition the angular orientation signal received from the angular orientation gauge 25 via multiplier 98. The PAL 94 counter is re-initialized after each complete revolution of the drill bit 42 (as determined by receipt of the angular orientation signal), and the count of the counter therefore provides PAL 94 with an indication of spindle angular orientation. The decision logic unit of PAL 94 compares the angular orientation of the drill bit 42 to the beam blockage signal received via line receiver 96 and provides the results of the comparison to the encoder 101.

Encoder 101 provides a four state binary output indicating either no beam blockage, first instance of beam blockage (correlating to position y1 in FIGS. 5 and 6), second instance of beam blockage (correlating to position y2 in FIG. 5), or beam no longer blocked (correlating to position y3 in FIG. 6). The output of the encoder is provided to the control module of the circuit board drilling machine so that the precise position of the drill bit 42 can be recorded at the times beam blockage/unblockage occurs.

More particularly, when the first blockage of the laser beams is detected, a signal is sent from the encoder 101 to the control module of the drilling machine to record position y1. The first blockage of the laser beam also defines the shaft rotation angle of 0 degrees (as indicated by mark M in FIGS. 5 and 6), and begins the PAL 94 counter. The second instance of beam blockage correlates to blockage of the laser beam 80 by the drill bit 42 when the drill bit 42 is rotated 180 degrees from its angular position at the first instance of blockage (see FIG. 5). The encoder 101 sends a signal to the drilling machine control module to record position y2 at the second instance of beam blockage. The beam no longer blocked signal can be actuated only after the beam 80 has been continuously blocked by the drill bit 42 through all 360 degrees of rotation of the bit. Once blockage has occurred through all 360 degrees of rotation, beam blockage is monitored by the PAL 94 until no blockage of beam 80 occurs at the shaft rotation angle of 0 degrees. When this occurs, encoder 101 sends a signal to the command module of the drilling machine to record position y3. To determine drill tip length, PAL 94 is cleared by using the master reset input 100. Drill bit 42 is then oriented immediately above the focal point 78 of beam 80 and is lowered into the beam 80. The resultant occurrence of beam blockage determines the vertical position of drill tip 42.

The synchronous frequency multiplier 98 is used to increase the number of pulses per drill revolution received from the angular measurement gauge. In particular, the angular measurement gauge will provide readings of drill bit angular orientation at 60 degree intervals. The synchronous frequency multiplier 98 provides a means for interpolating drill bit angular position between the 60 degree marks provided by the angular measurement gauge 25, thereby increasing the resolution of the measurement of angular orientation of drill bit 42. The accuracy of the measurement of drill bit diameter and runout is accordingly enhanced, since the determination of angular orientation is an essential element of the diameter and runout measurements. It will be apparent that the phase relationship between the frequency multiplied signal and the actual angular orientation of the drill bit must remain constant over the measurement.

The calibration logic PAL 84 of sensor electronics 62 is programmed to automatically compensate the beam blockage signal received from the detector 68 for dust, dirt and debris in the optical path of laser beam 80, as well as providing compensation for long term laser power drift. The calibration logic employed by PAL 84 is depicted in flow sequence format in FIG. 9.

Figure 9:
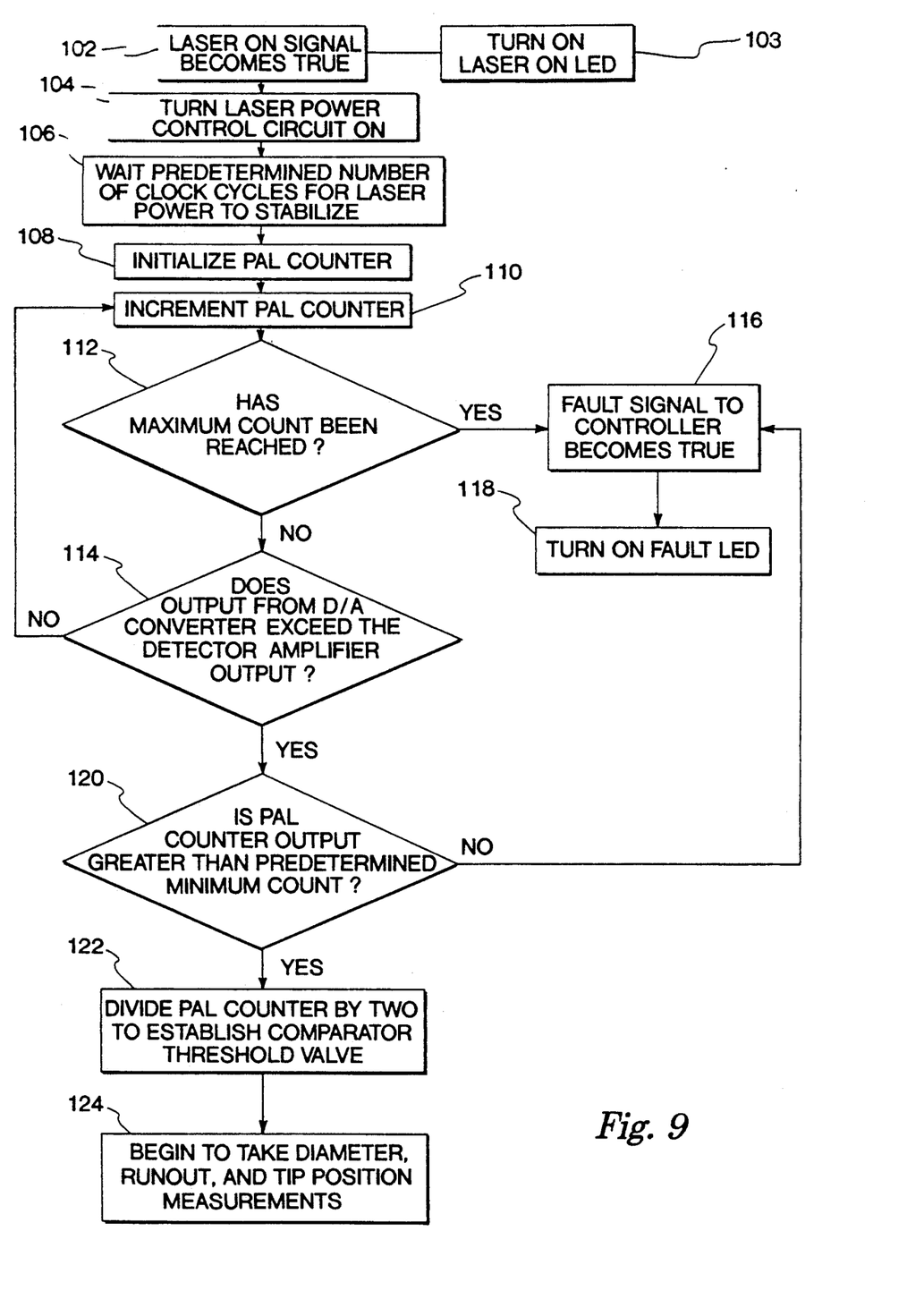
FIG. 9 is a logic flow diagram depicting the calibration sequence used to calibrate the sensor head to varying degrees of light occlusion caused by dust and debris by-products of the drilling process.

Referring to FIG. 9, the calibration sequence is initiated at block 102 when the laser power on switch 88 is actuated and PAL 84 energizes the laser. A signal is immediately provided, as indicated in block 103, to turn on the "laser on" LED indication light 76. Program flow then proceeds to block 104 where laser power control circuit 90 is energized.

Program flow next proceeds to block 106 where the calibration logic PAL 84 waits for a predetermined number of clock cycles, as provided by clock 86, to allow the laser power to stabilize. Program flow then proceeds to block 108 where a counter within the PAL 84 is initialized. The voltage output of D/A converter 85 is directly related to the value of the PAL 84 counter; the higher the count the higher the voltage output of the D/A converter 85. It will be recalled that the output of the D/A converter 85 is provided to comparator 81, and is used as a reference voltage for measurement of the output voltage of detector 68 to determine the amount of beam blockage. After the PAL counter is initialized in block 108 program flow proceeds to block 110 where the PAL 84 counter is incremented. Program flow then proceeds to decision block 112 where it is determined whether the PAL 84 counter has been incremented beyond a predetermined maximum count. If the maximum count for the PAL 84 counter has not been reached, program flow proceeds to decision block 114 where it is determined whether the voltage output of D/A converter 85 corresponding to the count of the PAL counter exceeds the amplifier output voltage of detector 68. If the output from the D/A converter 85 does not exceed the amplifier output of the detector 68, program flow is looped back to block 110 where the PAL counter is again incremented.

Program flow is directed from decision block 112 to block 116 if the PAL counter has been incremented above its predetermined maximum count. As described above, the count of the PAL 84 counter corresponds to the comparison voltage which is output from the D/A converter 85. If the comparison voltage from the D/A converter 85 reaches its predetermined maximum (i.e., the PAL counter reaches its predetermined maximum) before the comparison voltage reaches the level of the voltage output from detector 68, either the laser power control circuit 90, detector 68, or comparator 81 is not functioning properly. Program flow accordingly proceeds to block 116 where a fault signal is generated. Program flow proceeds from block 116 to block 118 to turn on the fault LED 74.

Program flow is directed from decision block 114 to decision block 120 when the output comparison voltage of D/A converter 85, as determined by the PAL 84 counter, is higher than the output voltage of detector 68. It will be appreciated that the value of the D/A converter comparison voltage, when program flow transitions from block 114 to 120, provides a reading of the detector output voltage with the drill bit 42 totally clear of the laser beam 80. At decision block 120, the count of the PAL 84 counter is compared to a predetermined minimum count to establish whether the comparison voltage from the D/A converter (and therefore the output voltage from detector 68) has reached a predetermined minimum voltage. If the minimum voltage has not been attained, it is an indication that there is either too much dust and debris occluding the laser beam to make a measurement, that a drill is blocking the laser beam 80, or that the laser power control circuit 90, detector 68, or comparator 81 is not functioning correctly. In the event that the PAL 84 counter output is less than the predetermined minimum, program flow proceeds from decision block 120 to block 116 where a fault signal is generated and the fault LED is turned on.

Program flow proceeds from decision block 120 to block 122 when the PAL 84 counter, and therefore the comparison voltage from D/A converter 85, exceed the required minimum. At decision block 122 the PAL counter is divided by 2 to establish a comparison voltage threshold value that is 50 percent of the output level of detector 68. The 50 percent comparator threshhold value so established is used to determine when 50 percent of the laser beam 78 is occluded by the drill bit 42 during the drill bit measurement operation. Accordingly, "beam blockage" is determined by comparator 81 when the amount of light detected by detector 68 is 50 percent of the amount of light impinging on the detector 68 when the drill bit 42 is totally clear of the laser beam 80. Program flow proceeds from block 122 to block 124 where measurement of the drill bit diameter, runout, and tip position is initiated.

The calibration logic sequence is performed by PAL 84 prior to each individual measurement of the drill bit 42. The output level of detector 68 with the drill bit 42 totally clear of the laser beam 80, as determined at decision block 114 of the calibration sequence flow diagram, is therefore reestablished prior to the taking of each measurement. Because "beam blockage" is determined as a predetermined percentage of the output voltage of detector 68 as measured just prior to passing the drill bit 42 through the laser beam 80, dust and debris in the laser beam 80 that may reduce the output voltage of the detector does not affect the determination of beam blockage by the drill bit 42.

Figure 11:
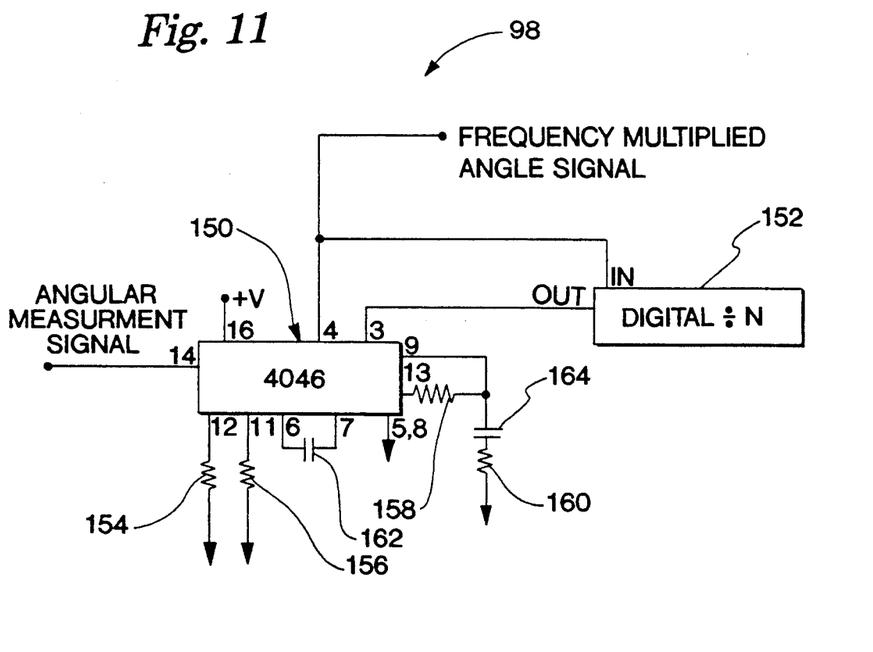
FIG. 11 is a detailed schematic of the synchronous frequency multiplier used in the decision logic electronics.

Referring to FIG. 11, the synchronous frequency multiplier 98 used in the decision logic electronics 77 (see FIG. 8) may be simply implemented with a phase locked loop (PLL) chip 150 such as the CD4046 integrated circuit chip manufactured by RCA, with a digital divide by n counter 152 placed in the feedback loop from the voltage controlled oscillator to the phase detector (pins 3 and 4 of the CD4046). The angular measurement signal from the angular measurement gauge 25 is provided to pin 14 of the PLL 150. The frequency range of the PLL 150 is determined by resistors 154, 156, 158, 160 and capacitors 162, 164. As described above the drill bit 42 is advantageously rotated at 10,000 to 100,000 rpm, and the angular measurement signal provided at pin 14 of PLL 150 gives an indication of drill bit orientation at 60 degree intervals. Accordingly, the frequency range of the PLL 150 is advantageously 10 KHz to 100 KHz. The frequency multiplier angular signal is provided from pin 4 of PLL 150 to the decision logic PAL 94.

Figure 10:
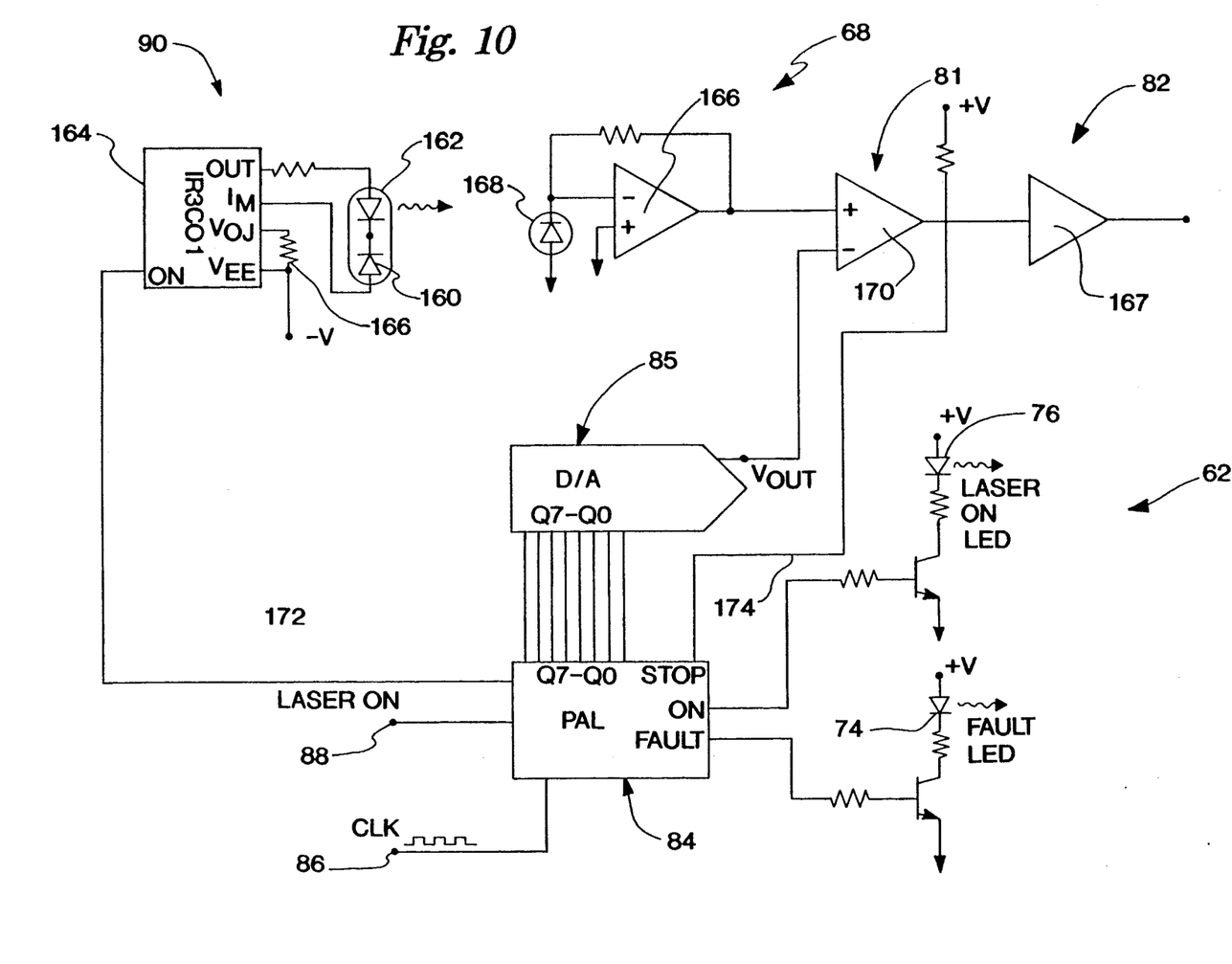
FIG. 10 is a detailed schematic of the sensor head electronics.

FIG. 10 is a detailed schematic of the sensor electronics 62. The laser control circuit 90 employs a photo diode 160 packaged with laser diode 162. The photo diode 160 monitors the optical intensity of the laser diode 162 to maintain a constant optical power output from the laser power control circuit 90. The laser diode 160 and photo diode 162 are driven by a laser diode drive integrated circuit chip 164, IR3C01, such as is available from Sharp Corporation, Sharp Plaza, Mahwah, N.J. Programming resistor 166 is used to select the optical power of the laser diode 162.

Detector 68 includes a transimpedance amplifier 166 which generates a voltage proportional to the amount of light falling on the photo diode 168 of the detector 68. Amplifier 170 of comparator 81 receives the output of amplifier 166, and compares the detector output to the reference voltage supplied by the output of D/A converter 85. Line driver 82 comprises a buffer amplifier 167 to provide the output of the comparator 81 to the line receiver 96 of the decision logic electronics 77.

D/A converter 85 receives its digital input via lines Q7 through Q0 from the PAL 84 counters Output line 172 from PAL 84 provides the on signal to actuate the laser diode driver 164. Feedback line 174 to PAL 84 provides a feedback signal from amplifier 170 to PAL 84 when the voltage level ($V_{out}$) established by the PAL 84 counters and the D/A converter 85 equals the output voltage of detector 68.

We claim:

1. An apparatus for measuring the lateral variation of a rotating element defining an operating envelope, comprising:
   angular measurement means for determining the angular position of said rotating element;
   sensor means for locating the edge of said envelope at first and second angular positions of said rotating element to provide first and second envelope edge positions; and
   measurement means for determining the linear difference between said first and second envelope edge positions whereby said linear difference provides a measure of said lateral variation.

2. The apparatus of claim 1, said angular measurement means including indicating means for providing an indication of the angular position of the rotating element at predetermined angular intervals.

3. The apparatus of claim 2, said angular measurement means further including interpolating means for interpolating the angular position of the rotating element between said predetermined intervals.

4. The apparatus of claim 3, said interpolating means including counter means for providing a count between said indications of the angular position of the rotating element.

5. The apparatus of claim 4, said interpolating means further including phase locked loop means, said counter means comprising a divide by n counter in the feed back loop of the phase locked loop means.

6. The apparatus of claim 1, said sensor means including means for transmitting a laser beam, means for shifting said rotating element through said laser beam, means for detecting said laser beam, and measurement means operably coupled to said detecting means for measuring the intensity of said laser beam whereby the presence or absence of said rotating element within said laser beam can be determined by measuring the intensity of the laser beam received by said detecting means.

7. The apparatus of claim 6, wherein said detector means includes means for providing a voltage output level corresponding to the amount of laser light striking said detector means, means for providing a reference voltage, and comparator means for comparing said output voltage to said reference voltage.

8. The apparatus of claim 7, said means for providing a reference voltage including means for determining the base line voltage output level of said detector means when said rotating element is not in said laser beam, and means for establishing said reference voltage as a predetermined fraction of said base line voltage.

9. The apparatus of claim 1, including means for shifting said rotating element through said laser beam, said first angular position being located when said rotating element first enters the laser beam and said second angular position being spaced generally 180° apart from said first angular position.

10. An apparatus for detecting the presence of an object, comprising:
    transmitting means for providing a source of energy;
    sensor means for receiving energy transmitted from said transmitting means;
    means for shifting said object from a first position clear of said transmitting means and said sensor means, to a second position wherein said object blocks at least a portion of the energy transmitted by said transmitting means from being detected by said sensor means;
    energy measurement means operably coupled to said sensor means for measuring the energy level received by said sensor means from said transmitting means;
    calibration means for setting a baseline energy level when said object is in said first position and means for setting a threshold energy level at a predetermined percentage of said base line energy level, whereby the value of said threshold energy level varies in direct relationship with variations in the base line energy level; and
    comparison means for determining when the energy level received by said sensor means is at or below said threshold energy level due to said object being in said second position.

11. The invention as claimed in claim 10, said transmitting means comprising means for transmitting a laser beam, and said sensor means including means for detecting the presence of said laser beam.

12. The invention as claimed in claim 11, said energy measurement means including means for determining the intensity of said laser beam as detected by said sensor means in the absence of said object occluding said laser beam.

13. The invention as claimed in claim 10, said comparison means including means for determining when the energy level sensed by said sensor means is outside of an acceptable range of energy levels.

14. The invention as claimed in claim 13, including fault indicating means operably coupled to said comparison means for providing a fault signal when said energy level is outside of said acceptable range.

15. The invention as claimed in claim 10, said sensor means including means for establishing a voltage level corresponding to the energy level received by said sensor means and counter means for representing said voltage level as a numerical value, said calibration means comprising means for dividing the numerical value presented by said counter means when said object is in said first position by a predetermined factor to establish said threshold energy level.

16. The invention as claimed in claim 15, said angular measurement means including indication means for providing an indication of the angular position of the rotating element at predetermined angular intervals.

17. The invention as claimed in claim 16, said angular measurement means further including interpolating means for interpolating the angular position of the rotating element between said predetermined intervals.

18. The apparatus of claim 17, said interpolating means including counter means for providing a count between said indications of the angular position of the rotating element, the value of said count providing an indication of the angular position of said rotating element between said predetermined intervals.

19. The apparatus of claim 18, said interpolating means further including phase locked loop means, said counter means comprising a divide by n counter in the feed back loop of the phase locked loop means.

20. The invention of claim 19, said measurement means including calibration means for setting a base line light level when said object is outside of said laser beam, and for setting a threshold light level at a predetermined percentage of said base line light level, whereby the value of said threshold light level varies in direct relationship with variations in the base line light level.

21. An apparatus for measuring the operating dimensions of a rotating drill bit rotating object comprising:
   means for providing a laser beam;
   sensor means for detecting said beam;
   angular measurement means operably coupled to said rotating object for determining the angular position of said object;
   measurement means for detecting the occlusion of light from said sensor means by said object when said object is brought within said beam;
   correlating means operably coupled to said angular measurement means and said measurement means for correlating said angular position of said object to the occlusion of light from said sensor means by said object.

22. The apparatus of claim 21, said angular measurement means including indicating means for providing an indication of the angular position of the rotating element at predetermined angular intervals.

23. The apparatus of claim 21, said angular measurement means further including interpolating means for interpolating the angular position of the rotating element between said predetermined intervals.

24. The apparatus of claim 23, said interpolating means including counter means for providing a count between said indications of the angular position of the rotating element.

25. The apparatus of claim 24, said interpolating means further including phase locked loop means, said counter means comprising a divide by n counter in the feed back loop of the phase locked loop means.

26. The apparatus of claim 21, including means for shifting said rotating object along a path of travel through said laser beam, said correlating means including means for correlating the position of said rotating object along said path of travel with the occlusion of light detected by said measurement means.

27. An apparatus for measuring the operating dimensions of a rotating element defining an operating envelope, comprising:
   angular measurement means for determining the angular orientation of said rotating element;
   transmitting means for providing a source of energy along an energy path of travel;
   sensor means for receiving energy transmitted from said transmitting means;
   means for shifting said element from a position clear of said energy path of travel to a second position along said energy path of travel wherein at least a portion of said transmitted energy is occluded by said element from being received by said sensor means;
   correlating means operably coupled to said angular measurement means and said sensor means for correlating said angular position of said element to the occlusion of energy from said sensor means by said element.

28. The apparatus of claim 27, said angular measurement means including indicating means for providing an indication of the angular position of the rotating element at predetermined angular intervals.

29. The apparatus of claim 27, said angular measurement means further including interpolating means for interpolating the angular position of the rotating element between said predetermined intervals.

30. The apparatus of claim 27, said interpolating means including counter means for providing a count between said indications of the angular position of the rotating element.

31. The apparatus of claim 27, said interpolating means further including phase locked loop means, said counter means comprising a divide by n counter in the feed back loop of the phase locked loop means.

32. The apparatus of claim 27, said correlating means including means for correlating the position of said rotating element along said path of travel to the occlusion of energy from said sensor means by said element.

* * * * *